United States Patent [19]

Lee et al.

[11] Patent Number: 5,314,845
[45] Date of Patent: May 24, 1994

[54] TWO STEP PROCESS FOR FORMING VOID-FREE OXIDE LAYER OVER STEPPED SURFACE OF SEMICONDUCTOR WAFER

[75] Inventors: Peter W. Lee, Fremont; David N. Wang, Saratoga, both of Calif.; Makoto Nagashima, Machida, Japan; Kazuto Fukuma, Ibaraki, Japan; Tatsuya Sato, Narita, Japan

[73] Assignee: Applied Materials, Inc., Santa Clara, Calif.

[21] Appl. No.: 474,177

[22] Filed: Feb. 2, 1990

Related U.S. Application Data

[63] Continuation-in-part of Ser. No. 413,800, Sep. 28, 1989, abandoned.

[51] Int. Cl.⁵ .............. H01L 21/00; H01L 21/02; H01L 21/302; H01L 21/463
[52] U.S. Cl. .................. 437/238; 437/225; 437/228; 437/235; 427/255.1; 427/255.2; 427/255.3
[58] Field of Search ............... 437/225, 228, 235, 238, 437/195; 427/38, 39, 51, 255.1, 255.2, 255.3; 204/192.12, 192.37

[56] References Cited

U.S. PATENT DOCUMENTS

| | | | |
|---|---|---|---|
| 3,584,264 | 6/1971 | McLouski et al. | 437/213 |
| 4,268,711 | 5/1981 | Gurev | 437/238 |
| 4,791,005 | 12/1988 | Becker et al. | 427/255.3 |
| 4,818,335 | 4/1989 | Karnett | 437/238 |
| 4,845,054 | 7/1989 | Mitchener | 437/238 |
| 4,872,947 | 10/1989 | Wang et al. | 427/38 |
| 4,892,753 | 1/1990 | Wang et al. | 427/294 |

FOREIGN PATENT DOCUMENTS

| | | | |
|---|---|---|---|
| 0212691 | 6/1986 | European Pat. Off. | C23C 16/40 |
| 0272140 | 12/1987 | European Pat. Off. | C23C 16/54 |
| 0086746 | 5/1984 | Japan | 437/195 |
| 0188145 | 10/1984 | Japan | 437/195 |
| 0171741 | 9/1985 | Japan | 437/195 |
| 2137808A | 10/1984 | United Kingdom | 437/195 |

OTHER PUBLICATIONS

Ghandhi, S., VLSI Fabrication Principles, Wiley & Sons, 1983, p. 423.
Sze, S., VLSI Technology, pp. 95, 107-108, McGraw-Hill, 1983.
Sze, S, Semiconductor Devices, p. 341, Wiley & Sons, 1985.

Primary Examiner—Brian E. Hearn
Assistant Examiner—B. Everhart
Attorney, Agent, or Firm—John P. Taylor

[57] ABSTRACT

A two step process is disclosed for forming a silicon oxide layer over a stepped surface of a semiconductor wafer while inhibiting the formation of voids in the oxide layer which comprises depositing a layer of an oxide of silicon over a stepped surface of a semiconductor wafer in a CVD chamber by flowing into the chamber a gaseous mixture comprising a source of oxygen, a portion of which comprises $O_3$, and tetraethylorthosilicate as the gaseous source of silicon while maintaining the pressure in the CVD chamber within a range of from about 250 Torr to about 760 Torr and then depositing a second layer of oxide over the first layer in a CVD chamber by flowing into the chamber a gaseous mixture comprising a source of oxygen, a portion of which comprises $O_3$; and tetraethylorthosilicate as the gaseous source of silicon while maintaining the CVD chamber at a lower pressure than during the first deposition step.

24 Claims, 1 Drawing Sheet

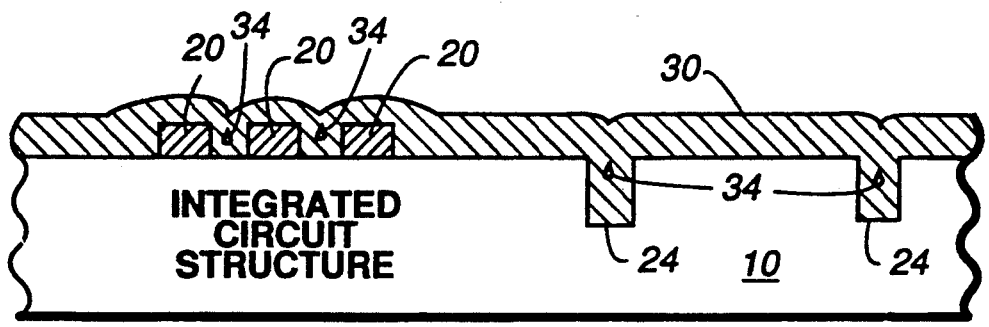
*Figure 1* (PRIOR ART)
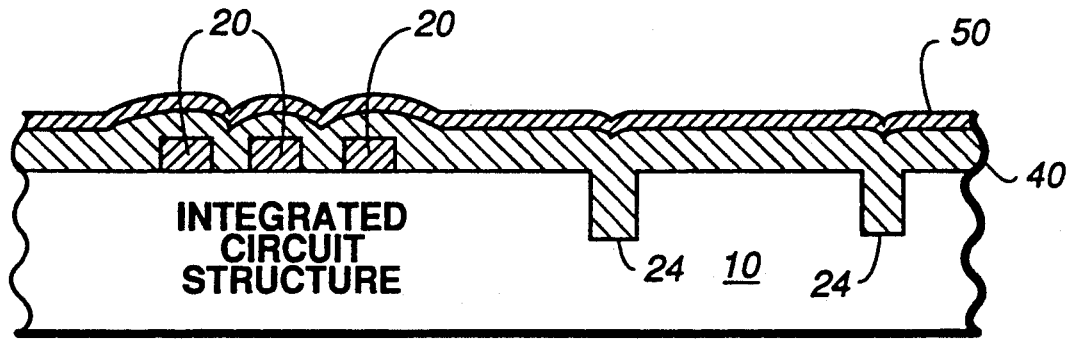
*Figure 2*
```
FORMING A VOID-FREE FIRST CVD
LAYER OF AN OXIDE OF SILICON
OVER A STEPPED SURFACE OF A
SEMICONDUCTOR WAFER
AT A PRESSURE OF ABOUT
250-760 TORR USING TEOS AND O₃
```
↓
```
FORMING A SECOND CVD LAYER OF AN
OXIDE OF SILICON OVER THE FIRST
CVD LAYER ON THE SEMICONDUCTOR
WAFER AT A FASTER DEPOSITION
RATE USING A PRESSURE OF ABOUT
40-<250 TORR USING TEOS AND O₃
```
*Figure 3*

TWO STEP PROCESS FOR FORMING VOID-FREE OXIDE LAYER OVER STEPPED SURFACE OF SEMICONDUCTOR WAFER

CROSS REFERENCE TO RELATED APPLICATIONS

This application is a continuation-in-part application to U.S. patent application Ser. No. 413,800 filed Sep. 28, 1989, now abandoned, and assigned to the assignee of this invention.

BACKGROUND OF THE INVENTION

1. Field of the Invention

This invention relates to a process for forming an oxide layer over a stepped surface of a semiconductor wafer. More particularly, this invention relates to a two step process for forming an oxide layer over a stepped surface of a semiconductor wafer which inhibits the formations of voids in the regions being filled with oxide between raised portions of the wafer surface.

2. Description of the Related Art

The formation of oxide layers over stepped surfaces of a semiconductor wafer is a well known technique either for forming an insulating layer or a planarizing layer or both. For example, if the stepped surface is the result of the formation of raised conductive lines on the surface of the wafer over other previously formed integrated circuit structures, deposition of an oxide layer over and in between the conductive lines will serve as both insulation for the conductive lines as well as a planarizing media.

Similarly, if the stepped surface is the result of the formation of slots or trenches in the wafer, for example, to provide electrical isolation between adjacent active devices formed in the wafer, it will be desirable to at least partially fill the slot or trench with an oxide insulation material which will also serve as a planarizing material.

In both instances, a problem of void formation can occur, during the deposition of oxide, in the regions between closely spaced apart raised lines and/or in high aspect ratio trenches. Void formation occurs when oxide forms at a slower rate adjacent the bottom portions of the trench or space between raised lines than along the upper regions of the sidewalls, especially at the upper corners, which results in a necking in of the oxide and trapping of an unfilled or void region below the necked in region. Subsequent planarization may remove enough overlying oxide to expose this void region with deleterious consequences.

The use of a doped glass, which will flow when heated to a temperature below that which will damage the wafer and integrated circuit structures already constructed therein, is known to at least partially solve the problem of formation of such voids, as well as to assist in planarization of a stepped structure.

However, it is not always desirable to use doped insulation materials because of the possible migration of the dopants into the adjacent structure in the semiconductor wafer during subsequent heating as well as the hygroscopic nature of such materials.

In our parent application Ser. No. 143,800, cross-reference to which is hereby made, we taught the use of a two step chemical vapor deposition (CVD formation) of a boron phosphorus silicate glass (BPSG), using tetraethylorthosilicate (TEOS) as the source of silicon. In the process claimed therein, the first step is carried out without the assistance of a plasma to form a majority of the desired doped oxide glass under conditions which inhibit void formation, and then the balance of the deposition is carried out, in a second step, in the presence of a plasma which results in a second coating layer which is less hygroscopic.

It would, however, be desirable to be able to provide a process for forming an oxide layer over a stepped surface of a semiconductor wafer, while inhibiting void formation, which could be used to form either a doped or undoped oxide glass layer.

SUMMARY OF THE INVENTION

It is, therefore, an object of the invention to provide a two step process for the formation of an oxide layer over a stepped surface of a semiconductor wafer while inhibiting the formation of voids in the oxide being formed.

It is another object of the invention to provide a two step process for the formation of an oxide layer over a stepped surface of a semiconductor wafer, using tetraethylorthosilicate (TEOS) as the source of silicon, and $O_3$ as a portion of the source of oxygen; which comprises forming oxide in the regions between raised portions of the wafer in a first step at a pressure of from about 250 Torr to about 760 Torr, and forming the balance of the oxide layer in a second step at a lower pressure.

It is yet another object of the invention to provide a two step process for the formation of an oxide layer over a stepped surface of a semiconductor wafer, using TEOS as the source of silicon, and $O_3$ as a portion of the source of oxygen; which comprises forming oxide in the regions between raised portions of the wafer in a first step at a pressure of from about 250 Torr to about 760 Torr, and forming the balance of the oxide layer in a second step at a pressure of from about 40 Torr to below 250 Torr.

It is still another object of the invention to provide a two step process for the formation of an oxide layer over a stepped surface of a semiconductor wafer, using TEOS as the source of silicon, and $O_3$ as a portion of the source of oxygen; which comprises forming oxide in the regions between raised portions of the wafer in a first step at a pressure of from about 300 Torr to about 760 Torr, and forming the balance of the oxide layer in a second step at a pressure of from about 40 Torr to about 200 Torr.

It is a further object of the invention to provide a two step process for the formation of an oxide layer over a stepped surface of a semiconductor wafer, using TEOS as the source of silicon, and $O_3$ as a portion of the source of oxygen; which comprises forming oxide in the regions between raised portions of the wafer in a first step at a pressure of from about 500 Torr to about 760 Torr, and forming the balance of the oxide layer in a second step at a pressure of from about 40 Torr to about 100 Torr.

It is yet a further object of the invention to provide a two step process for the formation of an oxide layer over a stepped surface of a semiconductor wafer, using TEOS as the source of silicon, with or without a gaseous source of boron and/or phosphorus; which comprises forming oxide in the regions between raised portions of the wafer in a first step at a pressure of from about 500 Torr to about 760 Torr, with or without the assistance of a plasma in the CVD chamber, and forming the balance of the oxide layer in a second step at a pressure of from about 40 Torr to about 100 Torr, also with or without the assistance of a plasma in the CVD chamber.

These and other objects of the invention will be apparent from the following description and accompanying drawings.

BRIEF DESCRIPTION OF THE DRAWINGS

FIG. 1 is a vertical cross-sectional view of a prior art structure representing a semiconductor wafer with a stepped surface formed by closely spaced apart raised lines and high aspect ratio trenches and a planarizing layer of oxide with voids shown formed in the cavities between the raised lines and in the trenches.

FIG. 2 is a vertical cross-sectional view of a semiconductor wafer having a stepped surface showing the composite oxide layer formed by the process of the invention comprising a void-free oxide layer formed by CVD deposition at high pressure and a further oxide layer formed by CVD deposition at a lower pressure.

FIG. 3 is a flowsheet illustrating the process of the invention.

DETAILED DESCRIPTION OF THE INVENTION

In accordance with the invention, a composite oxide insulating and planarizing layer is formed over stepped surfaces of a semiconductor wafer by a novel two step process. The composite oxide layer formed by the process of the invention is characterized by the absence of discernible voids.

The two step oxide deposition process of the invention comprises a first step to form a void-free oxide layer 40, as shown in FIG. 2, by a high pressure CVD deposition using gaseous tetraethylorthosilicate (TEOS) as the source of silicon, and one or more gaseous sources of oxygen, a portion of which comprises $O_3$; and then a second step to form a further layer 50 of oxide by a low pressure deposition process while again using a gaseous source of oxygen, including $O_3$, and TEOS as the source of silicon, to provide a further layer of oxide over the stepped wafer, which is deposited at a higher rate.

By use of the term "stepped surfaces of a semiconductor wafer" is meant a semiconductor wafer having surfaces wherein portions are raised with respect to the height of the surface therebetween and thus may include structures raised with respect to the entire surface, such as raised lines on a wafer surface, as well as wafer surfaces having trenches formed therein, particularly high aspect ratio trenches, i.e., trenches with depth to width ratios greater than 1, wherein, for example, the sidewalls of the trench or slot are raised with respect to the bottom of the trench. Therefore, expressions herein, such as "raised portions of the wafer", are meant to describe surface topographies which include both raised lines as well as the sidewalls of narrow trenches formed in the wafer.

For the first deposition step, the semiconductor wafer is placed on a support base or susceptor in a CVD chamber of a vacuum deposition apparatus such as, for example, a 5000 Series System available from Applied Materials, Inc. The wafer and the susceptor are heated to a temperature within a range of from about 300° C. to about 600° C., preferably from about 350° C. to about 450° C., and then maintained within this temperature range throughout the deposition.

In accordance with the invention, during the first deposition step, the chamber is maintained at a high pressure within a range of from about 250 Torr to about 760 Torr, preferably from about 300 torr to about 760 Torr, and most preferably from about 500 Torr to about 760 Torr, during the deposition.

Conducting the first deposition within this high range of pressure will result in a low deposition rate, which may range from about 100 to about 500 Angstroms/minute (A/min), typically about 300 A/min, and a step coverage rate of over 150%. The term "step coverage rate" is defined as the rate of deposition on vertical surfaces (e.g., sidewalls of raised lines or trench sidewalls) divided by the rate of deposition on vertical surfaces such as the tops of the raised lines or the bottom of trenches. For example, if the distance between two raised lines is 0.5 microns and the height of the lines is 1 micron, a deposition rate resulting in a step coverage of over 150% would mean that a deposition of 0.25 microns on each of the vertical surfaces of the raised lines would cause the oxide deposited on the sidewalls between the raised lines to meet, while only about 0.16–0.17 microns of oxide was deposited on the top or horizontal surfaces of the wafer.

This combination of low deposition rate and high step coverage during the first deposition step has been found to result in the formation of a void-free oxide layer in the low regions in between raised portions of the wafer.

After placing the wafer in the CVD chamber, a gaseous mixture is admitted into the chamber comprising a gaseous source of oxygen, and tetraethylorthosilicate (TEOS) as the gaseous source of silicon. A carrier gas such as argon, nitrogen, or helium may also be present in the mixture of gases.

The gaseous source of oxygen may include various oxygen-containing gases including $O_2$, $O_3$, $H_2O_2$, and mixtures of same. Preferably, the gaseous source of oxygen will comprise a mixture of oxygen-containing gases containing at least 1 vol. % $O_3$, with the balance comprising $O_2$. This use of at least a small amount of $O_3$ in the oxygen-containing gas is of particular importance when a plasma is not used in the process. The gaseous source of oxygen may also include a carrier gas such as helium, argon, or nitrogen. However, at least 10 vol. % of such a mixture must comprise an oxygen-containing gas. The gaseous source of oxygen is flowed into the vacuum deposition chamber at a rate within a range of from about 500 to about 10,000 sccm.

As previously discussed, the source of silicon consists of tetraethylorthosilicate to assure formation of an essentially void-free layer of oxide. The tetraethylorthosilicate is usually mixed with an inert carrier gas such as argon, helium, or nitrogen; or an oxygen-containing carrier gas. The ratio of tetraethylorthosilicate and carrier gas should be from about 0.1 vol. % to about 20 vol. % tetraethylorthosilicate. The flow rate of the tetraethylorthosilicate/carrier gas mixture into the deposition chamber is within a range of from about 100 to about 10,000 sccm. The ratio of TEOS to $O_3$ may range from about 1:100 to about 2:1, but will typically be about 1:2.

The optimal total flow of the gaseous reactants into the deposition chamber to obtain the highest deposition rate will vary somewhat with the design and geometry of the particular vacuum apparatus utilized for the deposition process. If the flow rate is too high, the deposition rate will be lowered because the residence time of the gas in the chamber is too short for reaction; while use of a low flow rate results in reaction and deposition of the oxide or glass elsewhere in the vacuum chamber than on the silicon wafer on which the integrated circuit structures have been formed. Usually, the total flow of gases into the vacuum deposition chamber during either step will, therefore, range from about 650 sccm to about 20,000 sccm.

In accordance with the invention, the time of deposition during the first step will be controlled to permit deposition of a sufficient amount of oxide during the first deposition step to fill up the regions between raised portions of the wafer up to at least the level of the original surface of the raised portions of the wafer. The remaining amount of desired oxide is deposited during the second, low pressure, step until the desired total thickness of oxide has been reached.

The second deposition step may be carried out under conditions identical to the first deposition step with regard to temperature, gaseous components, and gas flow rates into the vacuum deposition chamber, except that during this second deposition step, the pressure is lowered to a level within a range of from below the pressure of the first step down to about 40 Torr, preferably within a range of from about 40 Torr to about 200 Torr, and most preferably within a range of from about 40 Torr to about 100 Torr.

Conducting the second deposition at a lower pressure results in a faster rate of deposition of oxide onto the semiconductor wafer. For example, when depositing oxide over the wafer while maintaining the pressure with the range of from about 40 torr to about 100 Torr, in accordance with the invention, oxide may be formed and deposited over the wafer at a rate of as high as 3000 A/min, in contrast to the average deposition rate, during the first high pressure deposition step, of about 100 A/min.

While conducting the first deposition step, in accordance with the invention, at a slow deposition rate is important to inhibit the formation of voids in the oxide layer used to fill the low regions on the wafer between raised portions of the wafer structure, such a deposition rate is very uneconomical unless actually necessary. Therefore, when one wishes to deposit further oxide, after the low region has been filled with oxide, to increase the total thickness of the oxide layer, it is very desirable to be able to increase the oxide deposition rate, particularly when the problem of void formation no linger exists.

Thus, for example, when the width of the region between raised lines (or the width of the trench or slot) is about 0.5 microns, as previously discussed, and the rate of deposition on vertical surfaces (during the first, high pressure, deposition step) is roughly 1.5 times that of the horizontal deposition rate, the deposition of about 0.25 microns on each of the sidewalls of the raised lines or trench walls will fill up the low region where voids may form, but will only result in the deposition of about 0.16 to 0.17 microns on the horizontal surfaces of the wafer structure. If it is desired to form a 1 micron layer of oxide over the horizontal surfaces, it would take an additional 83–84 minutes to deposit an additional 0.83–0.84 microns (8300–8400 Angstroms) of oxide on the structure at the deposition rate of about 100 A/min used in the first deposition step. In contrast, a deposition rate of 3000 A/min would form the desired additional oxide in less than 3 minutes.

While the process of the invention has been described for the two step deposition of an undoped layer of oxide on a stepped surface of a semiconductor layer, it should be noted that the process may also be used when depositing doped oxide, i.e., boron-doped glass (BSG), phosphorus-doped glass (PSG), or boron phosphorus-doped glass (BPSG) over the stepped surfaces of a semiconductor wafer.

When it is desired to deposit a doped oxide glass, utilizing the process of the invention, the gaseous sources of boron and phosphorus may comprise any gases respectively containing boron or phosphorus and other materials which will not interfere with the glass deposition and which are capable of decomposing to form a gas capable of reacting with both the TEOS and the source of oxygen, including $O_3$, in the specified pressure and temperature ranges of the process. Preferably, such gaseous sources of boron and phosphorus will be organic boron-containing and phosphorus-containing gases which will decompose at the deposition temperature with the remainder of the components of the gases volatilizing off and being removed by the vacuum pumping system used to maintain the particular pressure in the CVD chamber.

Examples of such gaseous sources of boron and phosphorus include triethylphosphine (TEPine), triethylphosphite (TEPite), trimethylphosphate (TMP), trimethylborate (TMB), (trimethylsilyl)phosphate, (trimethylsilyl)borate, and mixtures of same.

It should be noted, however, that the gaseous sources of boron or phosphorus need not be organic compounds. But the boron and/or phosphorus-containing compound or compounds used must not be so reactive as to react with the oxygen, including $O_3$, before decomposition of the TEOS. Hence, the requirement that the compound be reactive with both the $O_3$ and the decomposition products of the TEOS. It has been found that boron and/or phosphorus-containing organic compounds such as those recited above decompose sufficiently slow under the specified reaction conditions so as to permit the desired reaction with both the $O_3$ and the TEOS decomposition products.

The gaseous sources of boron and phosphorus dopants, when used, may be mixed with a suitable nonreactive carrier gas such as argon, helium, or nitrogen. The amount of the gaseous sources of boron and phosphorus present in such a carrier gas/gaseous dopant source mixture may range from about 2 to 100 wt. % of the dopant/carrier gas mixture with the balance comprising the carrier gas. It should be noted here that for some volatile organic dopant sources, the use of such a carrier gas is unnecessary.

When it is desired to form the oxide with boron, the gaseous source of boron (or mixture with carrier gas) may be flowed into the CVD chamber at a flow rate within a range of from about 10 to about 3000 standard cubic centimeters per minute (sccm). The gaseous source of phosphorus (or mixture with carrier gas) may also be flowed into the chamber at a rate of from about 10 to about 3000 sccm.

As an example, about 50 sccm each of the gaseous sources of boron and phosphorus dopants may be o flowed into the CVD chamber with about 1000 sccm TEOS-containing gas, about 2000 sccm of the $O_3$-containing gas to form a boron and phosphorus-doped oxide glass (BPSG).

It is also possible to conduct both the CVD steps of the invention while a plasma is ignited in the deposition chamber between the susceptor on which the wafer rests and the faceplate or "showerhead" through which the gases flow into the chamber. However, in particular when a plasma is used in conjunction with the first step of the process of the invention, the width between raised portion of the wafer should not exceed about 0.35 microns. If the spacing between raised lines or the width of the trench to be filled is less than about 0.35 microns, it is preferable that a plasma not be utilized during the first step of the process.

When a plasma is utilized, either in the first or second steps of the process, the power level of the plasma during such a plasma-assisted CVD deposition may range from about 25 to about 500 watts, preferably, from about 50 to about 200 watts.

To further illustrate the practice of the invention, a silicon wafer, having previously formed thereon a raised pattern of about 1 micron high polysilicon lines with a spacing of about 0.5 microns therebetween, was placed in a CVD chamber of an Applied Materials 5000 Series vacuum apparatus under a pressure of about 760 Torr and heated to a temperature of about 390° C. A mixture of gases was flowed over the wafer consisting of about 3000 sccm of TEOS (4 mole percent TEOS/balance helium) and about 4000 sccm of an oxygen mixture (8 wt. % $O_3$/92 wt. % $O_2$) for about 5.67 minutes to deposit, at a rate of about 300 A/min, an oxide layer of about 0.17 microns in thickness on the patterned silicon wafer which was sufficient to fill with oxide the low regions between the raised polysilicon lines.

The pressure in the chamber was then lowered to about 60 Torr and the deposition process was carried out for an additional 2.77 minutes to form a total oxide thickness of about 1 micron on the top surfaces of the polysilicon lines.

The wafer was then removed from the vacuum chamber and wet cleaned by dipping in a $H_2SO_4:H_2O_2:H_2O$ solution for 10 minutes to remove impurities from the newly formed oxide surface.

The wafer was then sectioned and examined under a 2000× microscope for the presence of voids in the oxide layer in the filled in regions between the polysilicon lines. No visible signs of voids were found.

Thus, the invention provides an improved process for forming an insulating and planarizing layer of oxide on a semiconductor wafer wherein an oxide layer essentially free of voids is formed at least between raised portions of a stepped semiconductor surface in a first CVD step using a gaseous mixture of TEOS and oxygen, including $O_3$, at a high pressure of from at least 250 Torr up to 760 Torr; and then a further layer of oxide is deposited over the structure at a higher deposition rate by using a lower pressure during a second deposition step.

Having thus described the invention, what is claimed is:

1. A two step process for forming a silicon oxide layer over a stepped surface of a semiconductor wafer while inhibiting the formation of voids in the oxide layer which comprises:
   a) depositing a void-free first layer of an oxide of silicon over said stepped surface of said semiconductor wafer in a CVD chamber by flowing into said chamber a gaseous mixture comprising a source of oxygen and tetraethylorthosilicate as the gaseous source of silicon, while maintaining the pressure in said CVD chamber within a range of from about 250 Torr to about 760 Torr to form said void-free oxide layer; and
   b) depositing a second layer of oxide over said void-free first oxide layer in said CVD chamber by flowing into said chamber a gaseous mixture comprising a source of oxygen and tetraethylorthosilicate as the gaseous source of silicone, while maintaining said CVD chamber at a pressure within a range of from about 40 Torr to below about 250 Torr.

2. The process of claim 1 wherein the pressure in said CVD chamber during said first deposition step is maintained within a range of from about 300 Torr to about 760 Torr.

3. The process of claim 2 wherein the pressure in said CVD chamber during said second deposition step is maintained within a range of from about 40 Torr to about 200 Torr.

4. The process of claim 3 wherein the pressure in said CVD chamber during said first deposition step is maintained within a range of from about 500 Torr to about 760 Torr.

5. The process of claim 4 wherein the pressure in said CVD chamber during said second deposition step is maintained within a range of from about 40 Torr to about 100 Torr.

6. The process of claim 1 wherein at least one of said deposition steps is carried out while maintaining a plasma in said CVD chamber at a power level of from about 25 to about 500 watts.

7. The process of claim 1 wherein both said first and second deposition steps are carried out while maintaining a plasma in said CVD chamber at a power level of from about 25 to about 500 watts.

8. The process of claim 1 wherein one or both of said deposition steps are carried out while also flowing one or more additional gases into said CVD chamber selected from the class consisting of a gaseous source of boron, a gaseous source of phosphorus, or a mixture of such gases.

9. A two step process for forming a silicon oxide layer over a stepped surface of a semiconductor wafer while inhibiting the formation of voids in the oxide layer which comprises:
   a) depositing a void-free first layer of an oxide of silicon over said stepped surface of said semiconductor wafer in a CVD chamber by flowing into said chamber a gaseous mixture comprising a source of oxygen, at least a portion of which comprises $O_3$, and tetraethylorthosilicate as the gaseous source of silicon, while maintaining the pressure in said CVD chamber within a range of from about 500 Torr to about 760 Torr to form said void-free oxide layer; and
   b) depositing a second layer of oxide over said void-free first oxide layer in a CVD chamber by flowing into said chamber a gaseous mixture comprising a source of oxygen, at least a portion of which comprises $O_3$, and tetraethylorthosilicate as the gaseous source of silicon, while maintaining said CVD chamber at a pressure within a range of from about 40 Torr to about 100 Torr.

10. The process of claim 9 wherein said first step is carried out until low regions on said stepped surface between raised portions of said surface are filled with oxide up to at least the original level of adjoining regions of said stepped surface prior to said deposition.

11. The process of claim 10 wherein said second step is carried out until about 1 micron of oxide has been deposited on horizontal surfaces of said wafer.

12. The process of claim 9 which further comprises maintaining a wafer temperature during said deposition steps within a range of from about 300° C. to about 600° C.

13. The process of claim 9 which further comprises maintaining a flow rate into said vacuum chamber of said gaseous source of oxygen within a range of from about 500 sccm to about 10,000 sccm during said deposition steps.

14. The process of claim 9 which further comprises maintaining a flow rate into said vacuum chamber of said gaseous TEOS within a range of from about 100 sccm to about 10,000 sccm during said deposition steps.

15. The process of claim 9 which further comprises maintaining a ratio of TEOS to $O_3$ within a range of from about 1:100 to about 2:1 during said deposition steps.

16. The process of claim 9 wherein said process further includes providing at least 1 vol. % $O_3$ in said gaseous source of oxygen with the balance comprising one or more gases selected from the class consisting of $O_2$, $H_2O_2$, helium, argon, and nitrogen, with at least 10 vol. % of such gases comprising an oxygen-containing gas.

17. The process of claim 9 wherein one or both of said deposition steps are carried out while also flowing one or more additional gases into said CVD chamber selected from the class consisting of a gaseous source of boron, a gaseous source of phosphorus, or a mixture of such gases.

18. The process of claim 17 which further comprises maintaining a flow rate into said vacuum chamber of each of said additional gases within a range of from about 10 sccm to about 3000 sccm during said deposition steps.

19. The process of claim 18 which further comprises maintaining a total flow rate into said vacuum chamber of said gaseous sources of boron, phosphorus, oxygen, and TEOS within a range of from about 650 sccm to about 20,000 sccm during said deposition steps.

20. The process of claim 9 wherein at least said second step is carried out while maintaining a plasma in said CVD chamber at a power level of from about 25 to about 500 watts.

21. The process of claim 9 wherein at least said first step is carried out while maintaining a plasma in said CVD chamber at a power level of from about 25 to about 500 watts.

22. The process of claim 9 wherein both said first and second deposition steps are carried out while maintaining a plasma in said CVD chamber at a power level of from about 25 to about 500 watts.

23. A two step process for forming a silicon oxide layer over a stepped surface of a semiconductor wafer while inhibiting the formation of voids in the oxide layer which comprises:
   a) depositing a void-free first layer of an oxide of silicon over said stepped surface of said semiconductor wafer in a CVD chamber by flowing into said chamber a gaseous mixture comprising:
      i) a source of oxygen, at least 1 vol. % of which comprises $O_3$, with the balance comprising one or more gases selected from the class consisting of $O_2$, $H_2O_2$, helium, argon, and nitrogen, with at least 10 vol. % of such gases comprising an oxygen-containing gas; and
      ii) tetraethylorthosilicate as the gaseous source of silicon; while maintaining a ratio of TEOS to $O_3$ in said gaseous mixture within a range of from about 1:100 to about 2:1 during said deposition of said first layer;
   b) maintaining the pressure in said CVD chamber within a range of from about 500 Torr to about 760 Torr; and
   c) then depositing a second layer of oxide over said void-free first oxide layer in a CVD chamber by flowing into said chamber a gaseous mixture comprising a source of oxygen, at least 1 vol. % of which comprises $O_3$; and tetraethylorthosilicate as the gaseous source of silicon, while maintaining said CVD chamber during said deposition of said second oxide layer at a pressure within a range of from about 40 Torr to about 100 Torr and while maintaining a ratio of TEOS to $O_3$ within a range of from about 1:100 to about 2:1 during said deposition of said second layer.

24. A two step process for forming a silicon oxide layer over a stepped surface of a semiconductor wafer which will form void-free oxide in low regions between raised portions of the wafer which comprises:
   a) depositing silicon oxide over said stepped surface of said semiconductor wafer in a CVD chamber by flowing into said chamber a gaseous mixture comprising a source of oxygen and tetraethylorthosilicate as the gaseous source of silicon, while maintaining the pressure in said CVD chamber within a range of from about 250 Torr to about 760 Torr until said low regions on said stepped surface between said raised portions of said surface are filled with oxide up to at least the original level of said raised portions of said stepped surface prior to said deposition, to form said void-free oxide; and
   b) depositing further oxide over said void-free oxide on said wafer in said CVD chamber by flowing into said chamber a gaseous mixture comprising a source of oxygen and tetraethylorthosilicate as the gaseous source of silicon, while maintaining said CVD chamber at a pressure below 250 Torr.

* * * * *